US007288997B2

(12) United States Patent
Chen

(10) Patent No.: US 7,288,997 B2
(45) Date of Patent: Oct. 30, 2007

(54) PHASE LOCK LOOP AND THE CONTROL METHOD THEREOF

(75) Inventor: Po-Chun Chen, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 11/068,622

(22) Filed: Feb. 28, 2005

(65) Prior Publication Data

US 2006/0103476 A1 May 18, 2006

(30) Foreign Application Priority Data

Nov. 15, 2004 (TW) .............................. 93134884 A

(51) Int. Cl.
*H03L 7/00* (2006.01)

(52) U.S. Cl. ............................ 331/16; 331/11; 331/14; 331/179

(58) Field of Classification Search .................. 331/16, 331/179, 11, 14
See application file for complete search history.

(56) References Cited

U.S. PATENT DOCUMENTS 4,682,116 A * 7/1987 Wolaver et al. ................ 327/5
6,259,327 B1 * 7/2001 Balistreri et al. ............. 331/11
6,747,519 B2 6/2004 Jaehne et al.
6,888,413 B1 * 5/2005 Adams et al. ................ 331/17

FOREIGN PATENT DOCUMENTS

TW 566003 12/2003

OTHER PUBLICATIONS

Taiwan Office Action mailed Sep. 20, 2006.
China Office Action mailed Sep. 1, 2006.

* cited by examiner

*Primary Examiner*—Benny Lee
*Assistant Examiner*—Levi Gannon
(74) *Attorney, Agent, or Firm*—Thomas, Kayden, Horstemeyer & Risley

(57) ABSTRACT

A phase lock loop and the control method thereof. The phase lock loop adjusts operating states automatically to generate a feedback clock for tracing a reference clock. The control method generates the first and second clocks corresponding to the highest and lowest frequency oscillating clocks respectively generated by the phase lock loop when operating in one of select states. The frequencies of the first and second clocks are compared to the frequency of the reference clock respectively, thereby holding the select state of the phase lock loop when the first, second, and reference clocks are in a first predetermined condition or changing the select state of the phase lock loop when in a second predetermined condition.

12 Claims, 10 Drawing Sheets

PHASE LOCK LOOP AND THE CONTROL METHOD THEREOF

BACKGROUND

The invention relates to a phase lock loop, and more specifically to a phase lock loop capable of adjusting states automatically and control method thereof.

FIG. 1A is a block diagram of a conventional phase lock loop (PLL), having a phase/frequency detector (PFD) 90, a charge pump 92, a voltage-controlled oscillator (VCO) 94, and a frequency divider 96. The PFD 90 detects the transitional edges of the feedback clock $Clk_{fb}$ and the reference clock $Clk_{ref}$ to generate comparative signals UP and DN which, in turn, charge and discharge the charge pump 92 to generate a control voltage $V_c$. The VCO 94 generates an output clock $Clk_{vco}$ of variable frequency in response to the control voltage $V_c$. The frequency divider 96 divides the frequency of the clock $Clk_{vco}$ to generate the feedback clock $Clk_{fb}$.

VCO is generally designed to operate in a single state, having a single voltage frequency transfer curve. There are two types of VCOs in terms of the voltage-frequency transfer curve slope, high gain and low gain VCOs. FIG. 1B shows two voltage-frequency transfer curves A and B, corresponding to high gain and low gain VCOs respectively. As depicted, high gain VCO provides the advantage of broader tuning frequency range. The performance of the output clock stability in high gain VCO, however, is inferior since frequency of the output clock is susceptible to the change in control voltage $V_c$. Conversely, low gain VCO provides a more stable frequency of the output clock but a narrower tuning frequency range. As a result, selecting a suitable voltage-frequency transfer curve for a VCO has been important for circuit designers.

SUMMARY

The present invention is generally directed to a phase lock loop capable of adjusting operating states automatically. According to one aspect of the invention, the phase lock loop generates a feedback clock for tracing a reference clock, the phase lock loop comprising a phase/frequency detector, a charge pump, a voltage-controlled oscillator and a state select circuit. The phase/frequency detector (PFD) compares phase difference between the feedback clock and the reference clock to generate a comparative signal. According to the comparative signal, the charge pump generates a control voltage to the voltage-controlled oscillator (VCO). The VCO then operates in one of the select states to generate an oscillating clock according to the control voltage and a select voltage wherein the ratio of the frequency of the oscillating clock to the frequency of the feedback clock is an integer. Moreover, the state select circuit adjusts the select voltage in accordance with the reference clock to select one of the select sates.

According to another aspect of the invention, a method for controlling a phase lock loop is disclosed. The phase lock loop capable of operating in a plurality of select states generates a feedback clock for tracing a reference clock and the method comprises generating first and second clocks corresponding to the highest and lowest frequency oscillating clocks respectively, generated by the phase lock loop when operating in one of the select states, comparing the frequencies of the first and second clocks to the frequency of the reference clock respectively, thereby holding the select state of the phase lock loop when the first, second, and reference clocks are in a first predetermined condition; or changing the select state of the phase lock loop when in a second predetermined condition.

DESCRIPTION OF THE DRAWINGS

The invention will be described by way of exemplary embodiments, but not limitations, illustrated in the accompanying drawings in which like references denote similar elements, and in which.

DETAILED DESCRIPTION

Figure 1A:
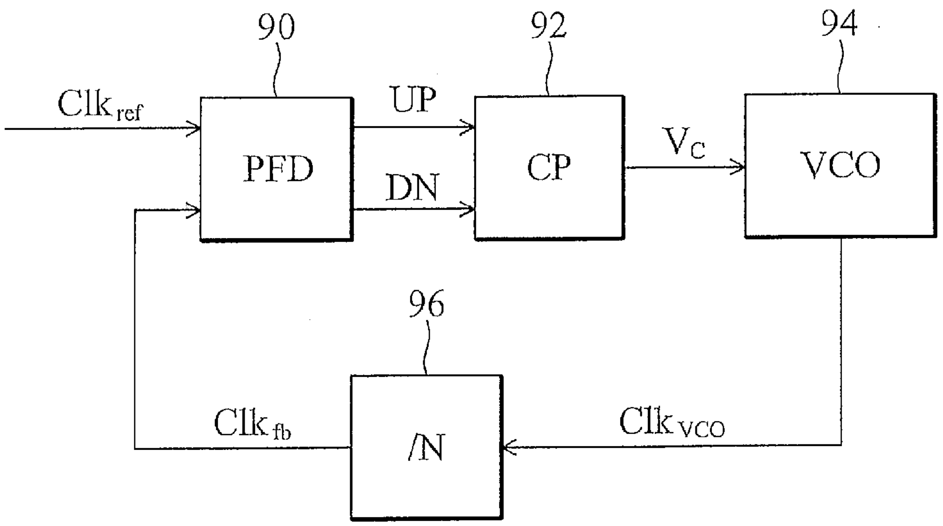
FIG. 1A is a block diagram of a related art phase lock loop.
Figure 1B:
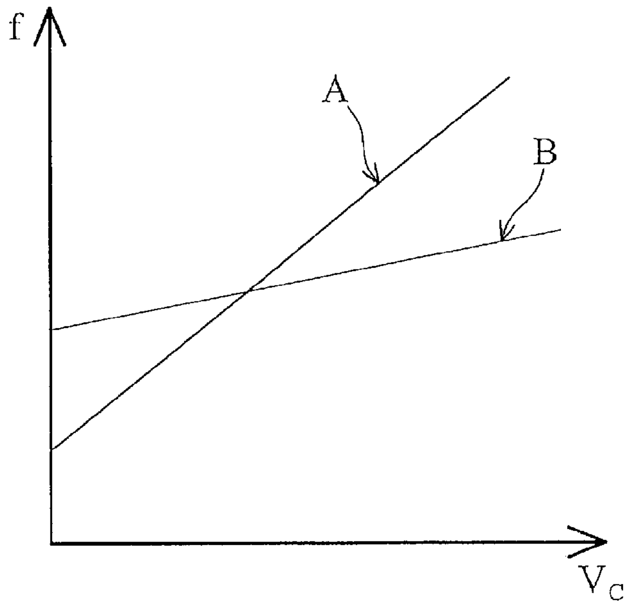
FIG. 1B is a schematic diagram of two voltage-frequency transfer curves A and B in a VCO.
Figure 2:
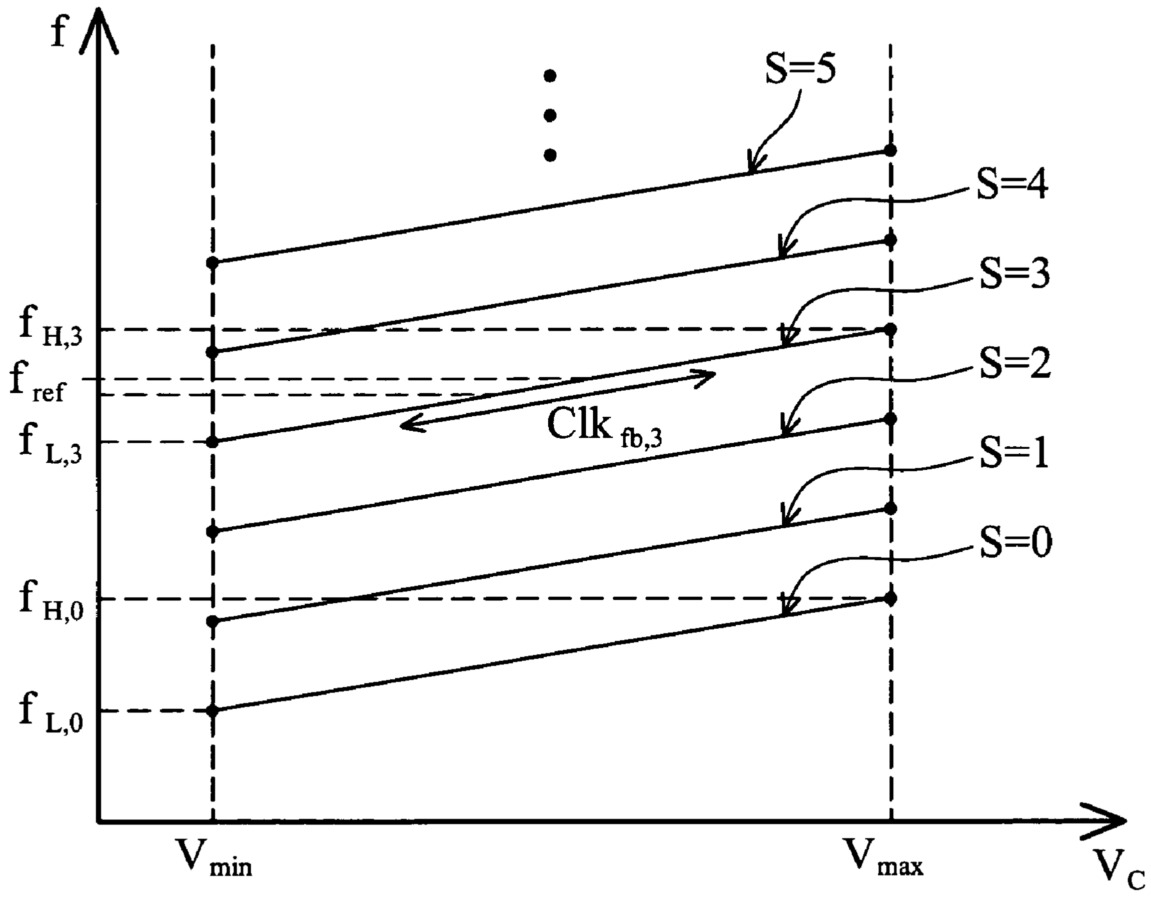
FIG. 2 is a schematic diagram of the voltage-frequency transfer curves in a VCO according to an embodiment of the invention.

FIG. 2 shows the voltage-frequency transfer curves of a VCO according to an embodiment of the invention. The VCO is capable of operating in a plurality of select states, S, and each select state S corresponds to a voltage-frequency transfer curve. In FIG. 2, $V_{min}$ and $V_{max}$ in x-axis, denote the maximum and minimum values of the input control voltage $V_C$ in the VCO, respectively and the denotation, $f_{L,S}$ in y-axis, denotes the frequency of the feedback clock generated by the frequency divider with the VCO when the VCO operates in a select state S and the control voltage $V_C$ is $V_{min}$. In other words, frequency $f_{L,S}$ is the lowest frequency of the feedback clock generated by the frequency divider and the VCO in select state S. Conversely, frequency $f_{H,S}$ is the highest frequency of the feedback clock generated by the frequency divider and the VCO in select state S. The tuning range of the feedback clock in each select sate preferably overlaps a small part of tuning range in the neighboring select state, thus ensuring that every frequency is covered by the tuning range of the feedback clock in at least one select state.

Figure 3:
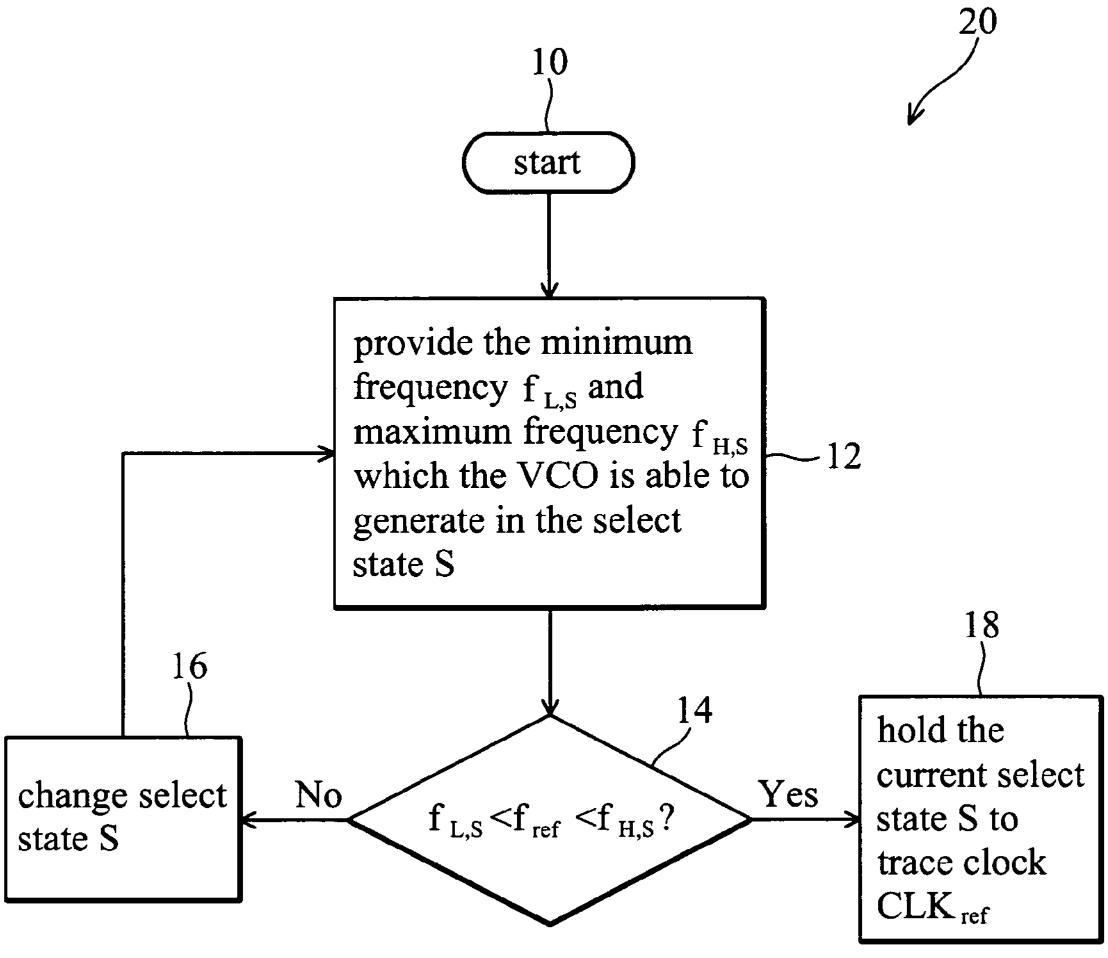
FIG. 3 is a flow diagram illustrating an embodiment of the invention.

When changing or selecting select state S of the VCO properly, this VCO is capable of tracing a reference clock $Clk_{ref}$ with frequency $f_{ref}$. In FIG. 3, a flow diagram illustrating an embodiment of the invention, corresponding frequencies $f_{L,S}$ and $f_{H,S}$ are provided according to the select state S of the VCO (step 12). It is determined whether the condition is fulfilled, $f_{L,S}<f_{ref}<f_{H,S}$ (step 14). If so, the combination of the VCO and the frequency divider in the current select state S is capable of generating an output clock with frequency $f_{ref}$. Consequently, the select state S of the VCO is held and tracing of the reference clock $Clk_{ref}$ is begun with the feedback clock generated by the VCO and frequency divider (step 18). If not, the select state S of the VCO (step 16) is changed. The rule of changing select states is, for example, changing select state S to another select state capable of generating a feedback clock with higher frequency if $f_{ref}>f_{H,S}$ or a lower frequency if $f_{ref}<f_{L,S}$.

Figure 4:
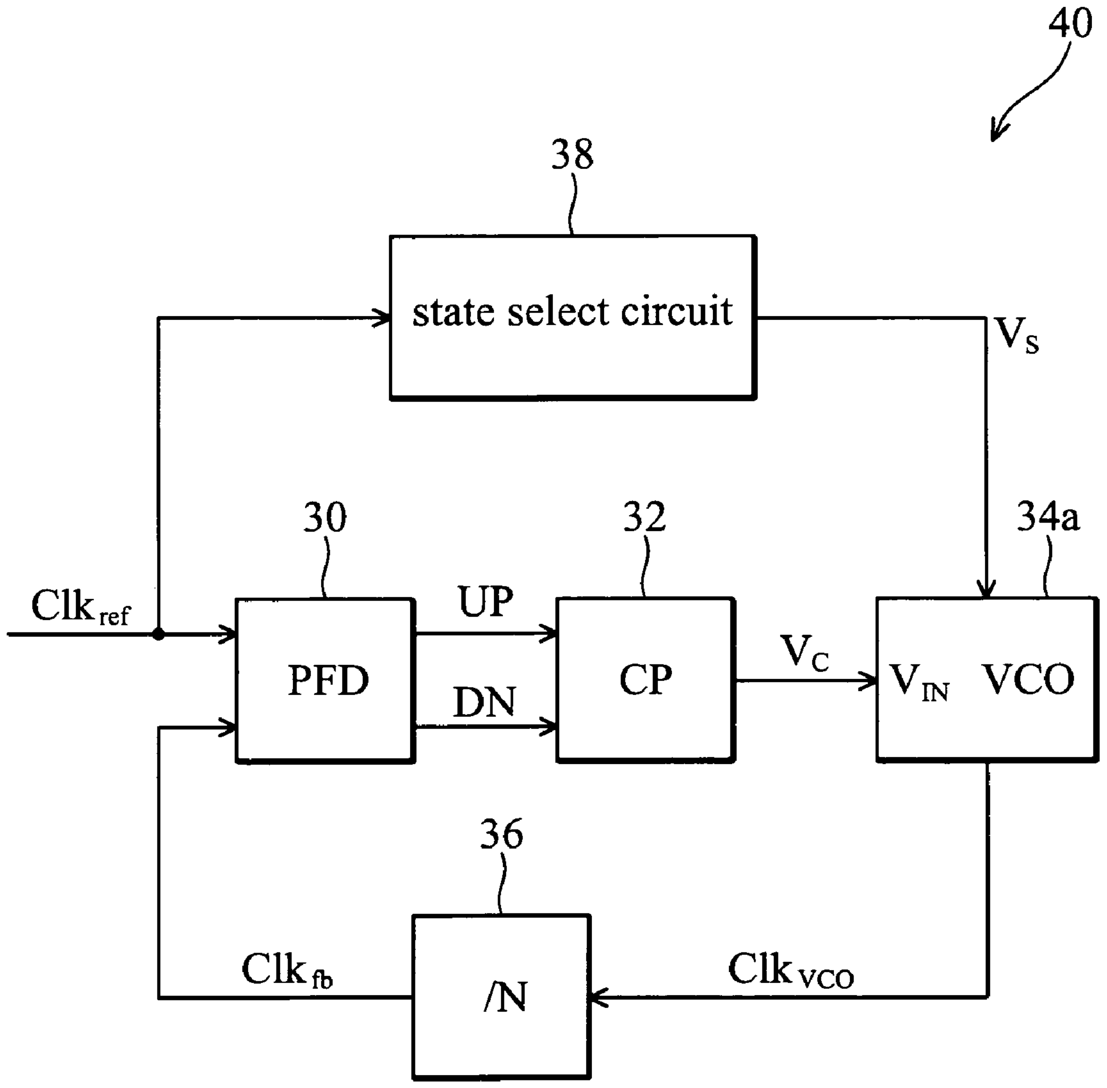
FIG. 4 is a block diagram of a phase lock loop according to an embodiment of the invention.

FIG. 4 shows a phase lock loop 40 according to an embodiment of the invention, comprising a phase/frequency detector (PFD) 30, a charge pump 32, a voltage-controlled oscillator (VCO) 34*a*, a frequency divider 36 and a state select circuit 38.

The PFD 30 compares the transitional edges of the feedback clock $Clk_{fb}$ and the reference clock $Clk_{ref}$ to generate comparative signals UP and DN. For example, when the PFD 30 detects the rising edge of the feedback clock $Clk_{fb}$ later than that of reference clock $Clk_{ref}$, the PFD 30 then generates a comparative signal UP wherein the signal UP takes the form of a pulse having a width or duration corresponding to the phase difference between rising edges of the reference and feedback clocks, $Clk_{ref}$ and $Clk_{fb}$. In a similar fashion, when the PFD 30 detects the rising edge of the feedback clock $Clk_{fb}$ earlier than that of the reference clock $Clk_{ref}$, the PFD 30 generates a comparative signal DN.

When receiving the respective comparative signals, UP and DN, the charge pump 32 charges and discharges the VCO 34*a* accordingly. For example, the magnitude of control voltage $V_c$ generated by the charge pump 32 is increased with the comparative signal UP and decreased with the comparative signal DN.

The VCO 34*a* operates in one of the select states, S, with the voltage-frequency transfer curve of the combination of the VCO 34*a* and the frequency divider 36 shown in FIG. 2. The phase lock loop 40 operates in one of the select states, S. Moreover, the select state S of the VCO 34*a* is controlled by a select voltage $V_s$ and the VCO 34*a* generates an oscillating clock $Clk_{vco}$ in response to the control voltage $V_c$ generated by the charge pump 32.

The frequency divider 36 divides the frequency of the oscillating clock $Clk_{vco}$ and generates the feedback clock $Clk_{fb}$ for an oscillating clock $Clk_{vco}$ with a frequency N times the frequency of the reference clock $Clk_{ref}$ and N is an integer.

When the select state S of the VCO 34*a* is fixed, that is, the select voltage $V_s$ is fixed, the operation of the phase/frequency detector (PFD) 30, the charge pump 32, the voltage-controlled oscillator (VCO) 34*a*, and the frequency divider 36 is the same as the operation of conventional PLLs and is not further described in detail here.

The state select circuit 38 receives the reference clock $Clk_{ref}$, examining the reference clock to generate a select voltage $V_s$ for adjusting select state S of the VCO 34*a*.

Figure 5:
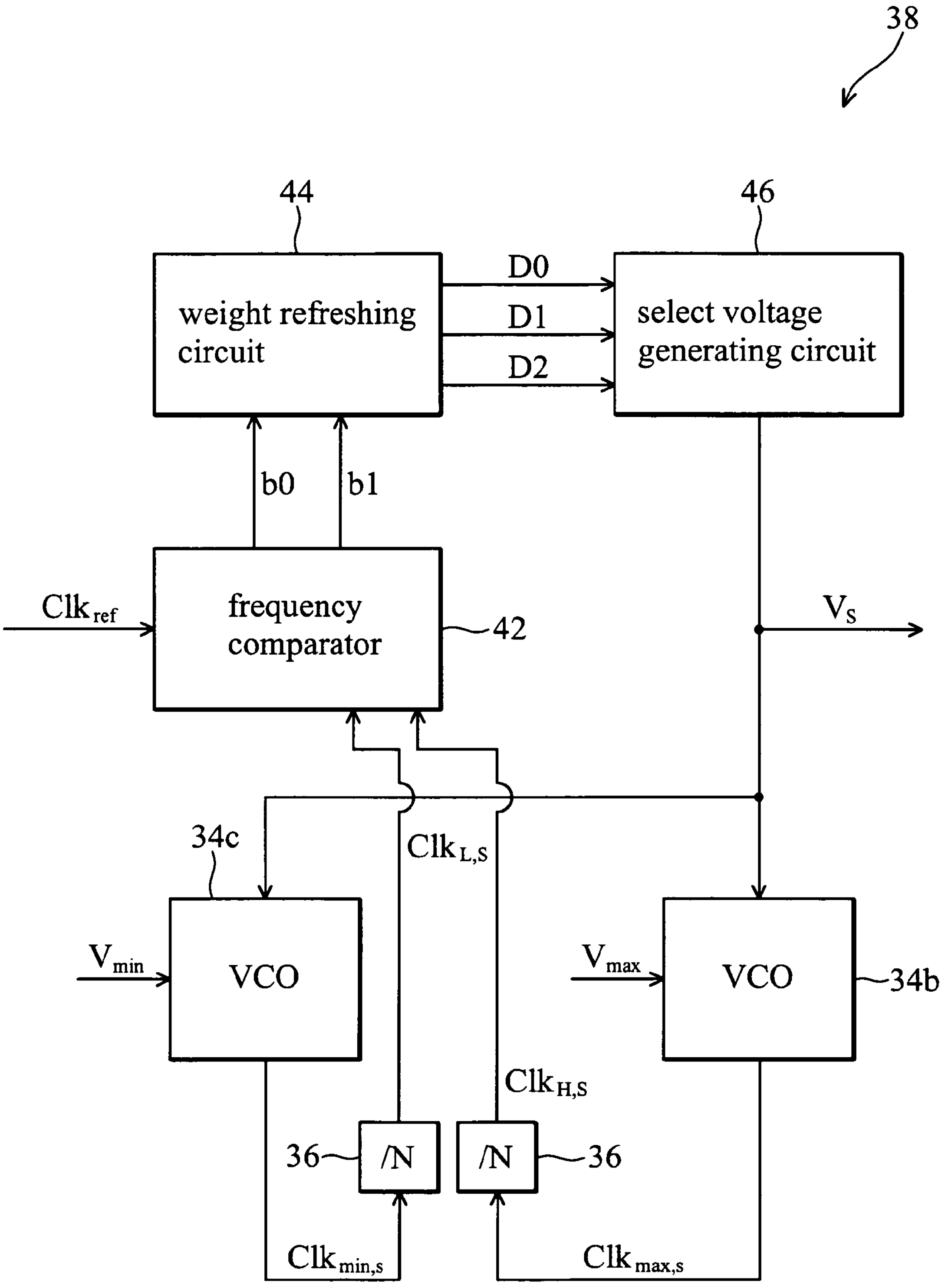
FIG. 5 is a block diagram of the state select circuit in FIG. 4.

FIG. 5 is a block diagram of the state select circuit 38 in FIG. 4. The state select circuit 38 checks if the frequency of the reference clock $Clk_{ref}$ is within the tuning frequency range of the VCO 34*a* and frequency divider 36 in the current select state S. VCO 34*b* and VCO 34*c* are similar to the VCO 34*a* in terms of internal circuit structure and all three VCOs receive the same select voltage $V_s$. The inputs $V_{in}$ of the VCO 34*a*, VCO 34*b* and VCO 34*c*, however, receive the control voltage $V_c$, a fixed voltage $V_{max}$ and another fixed voltage $V_{min}$ respectively. The fixed voltages $V_{max}$ and $V_{min}$ denote the maximum and minimum values of the control voltage $V_c$ respectively. Thus, the frequency of the oscillating clock $Clk_{max,s}$ generated by the VCO 34*b* corresponds to the highest frequency, $f_{max,s}$, by which VCO 34*a* is able to generate in the select state S. Similarly, the frequency of the oscillating clock $Clk_{min,s}$ generated by the VCO 34*c* corresponding to the lowest frequency, $f_{min,s}$, by which VCO 34*a* is able to generate in the select state S. As well the clocks $Clk_{H,S}$ and $Clk_{L,S}$ are the frequency divided versions of the clocks $Clk_{max,s}$ and $Clk_{min,s}$ and generated by frequency divider 36. The frequency comparator 42 then compares the frequency of the reference clock $Clk_{ref}$, $f_{ref}$, to determine whether the frequency $f_{ref}$ is between the frequencies $f_{max,s}$ and $f_{min,s}$, thereby generating digital signals b0 and b1 to the weight refreshing circuit 44. The weight refreshing circuit 44 then changes or holds the select state S in accordance with digital signals b0 and b1 and generate digital signals D0~D2 which record the select state S of the VCO 34*a* to the select voltage generating circuit 46. The select voltage generating circuit 46, such as a digital to analog converter converts the digital signals D0~D2 to the select voltage Vs which determines the select state S of the VCO 34*a*.

Further, there is provided a simple method to compare the frequencies of two clocks, calculating the number of transition edges of one clock during one period of another clock. Since there are only two transitional edges (rising and falling edge) in one period of a clock theoretically, the period of clock $Clk_b$ must be smaller than that of clock $Clk_a$ if there are three transitional edges of clock $Clk_b$ during one period of clock $Clk_a$. Thus, the frequency of clock $Clk_b$, $f_b$, is higher than the frequency of clock $Clk_a$, $f_a$. Conversely, if there are two or less transitional edges of clock $Clk_b$ during one period of clock $Clk_a$, the frequency of clock $Clk_b$, $f_b$, is equal to or lower than the frequency of clock $Clk_a$, $f_a$.

Figure 6:
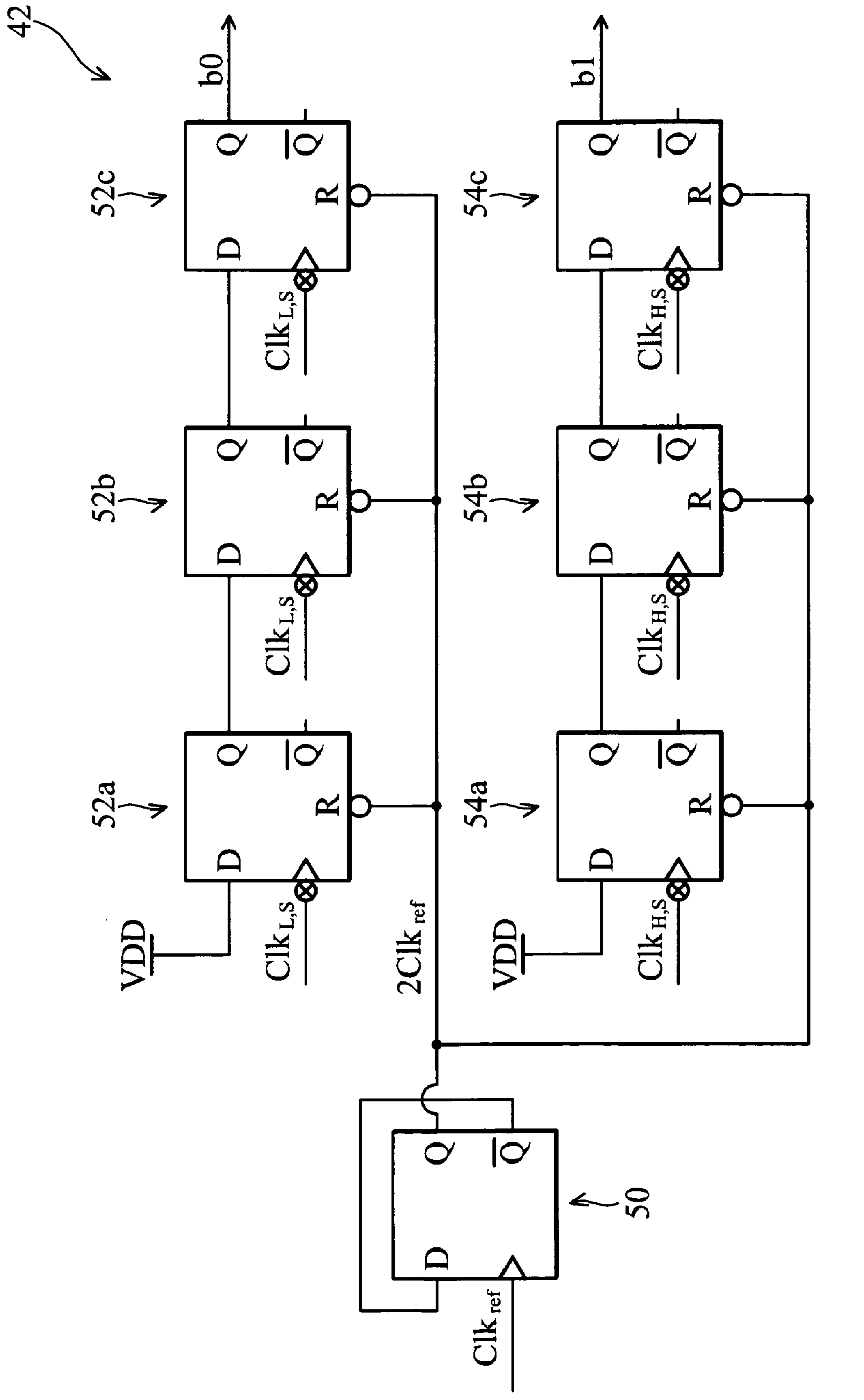
FIG. 6 is a schematic diagram of the frequency comparator in FIG. 5.

FIG. 6 shows the frequency comparator 42 in FIG. 5. The D type flip-flop 50 is a rising edge triggered flip flop used as a divider with dividing ratio, 2, to divide the frequency of clock $Clk_{ref}$ by 2, thereby generating clock $2Clk_{ref}$ and D type flip-flops 52*a*~52*c* and 54*a*~54*c* are double edge triggered flip-flops wherein the resets thereof are connected to clock $2Clk_{ref}$. D type flip-flops 52*a*~52*c* are coupled in series wherein the positive output Q of each D type flip-flops is connected to the input D of the next D-type flip-flop and the clock inputs of D-type flip-flops 52*a*~52*c* receive clock $Clk_{L,S}$. The input D of D-type flip-flop 52*a* is tied to a high voltage VDD (i.e. logic value "1"). D-type flip-flop 52*c* generates digital signal b0 at positive output Q therein. Thus, the D-type flip-flops operate as a comparison circuit to determine the number of transitional edges of clock $Clk_{L,S}$ during one period of clock $Clk_{ref}$. Since all the resets of D-type flip-flops 52*a*~52*c* receive clock $2Clk_{ref}$, that is, the D-type flip-flops 52*a*~52*c* operate normally during one period of clock $Clk_{ref}$ but are reset in the following period of clock $Clk_{ref}$. After reset, all the outputs Q of D-type flip-flops 52*a*~52*c* are logic "0". Hence, when D-type flip-flops 52*a*~52*c* operate normally, the output Q of a double triggered D-type flip-flop is logic "1" with input D having a logic value "1" in response to the transitional edge of clock $Clk_{L,S}$. The digital signal b0, therefore, will only be logic "1" when there are three or more transitional edges of clock $Clk_{L,S}$ during one period of clock $Clk_{ref}$, otherwise signal b0 is "0". The inter-connection and operation of D-type flip-flops 54*a*~54*c* are similar to D-type flip-flops 52*a*~52*c*. Therefore, only there are three or more transitional edges of clock $Clk_{H,S}$ during one period of clock $Clk_{ref}$ that digital signal b1 will be logic "1", otherwise logic "0".

Whether the frequency of clock $Clk_{ref}$, $f_{ref}$, falls within the tuning frequency range of VCO 34*a* in current select state S can be obtained by signals b0 and b1. Table 1 shows the possible logic combinations of signals b0 and b1, and the corresponding illustrations and subsequent action that are taken.

TABLE 1

| b0 | b1 | illustrations | subsequent action |
|---|---|---|---|
| 0 | 0 | $f_{ref} < f_{L,S}$ | Change select state S to generate a lower frequency oscillating clock |
| 0 | 1 | Not allowed | No action |
| 1 | 0 | $f_{L,S} =< f_{ref} < f_{H,S}$ | Hold current select state S |
| 1 | 1 | $f_{ref} >= f_{H,S}$ | Change select state S to generate a higher frequency oscillating clock |

Figure 7:
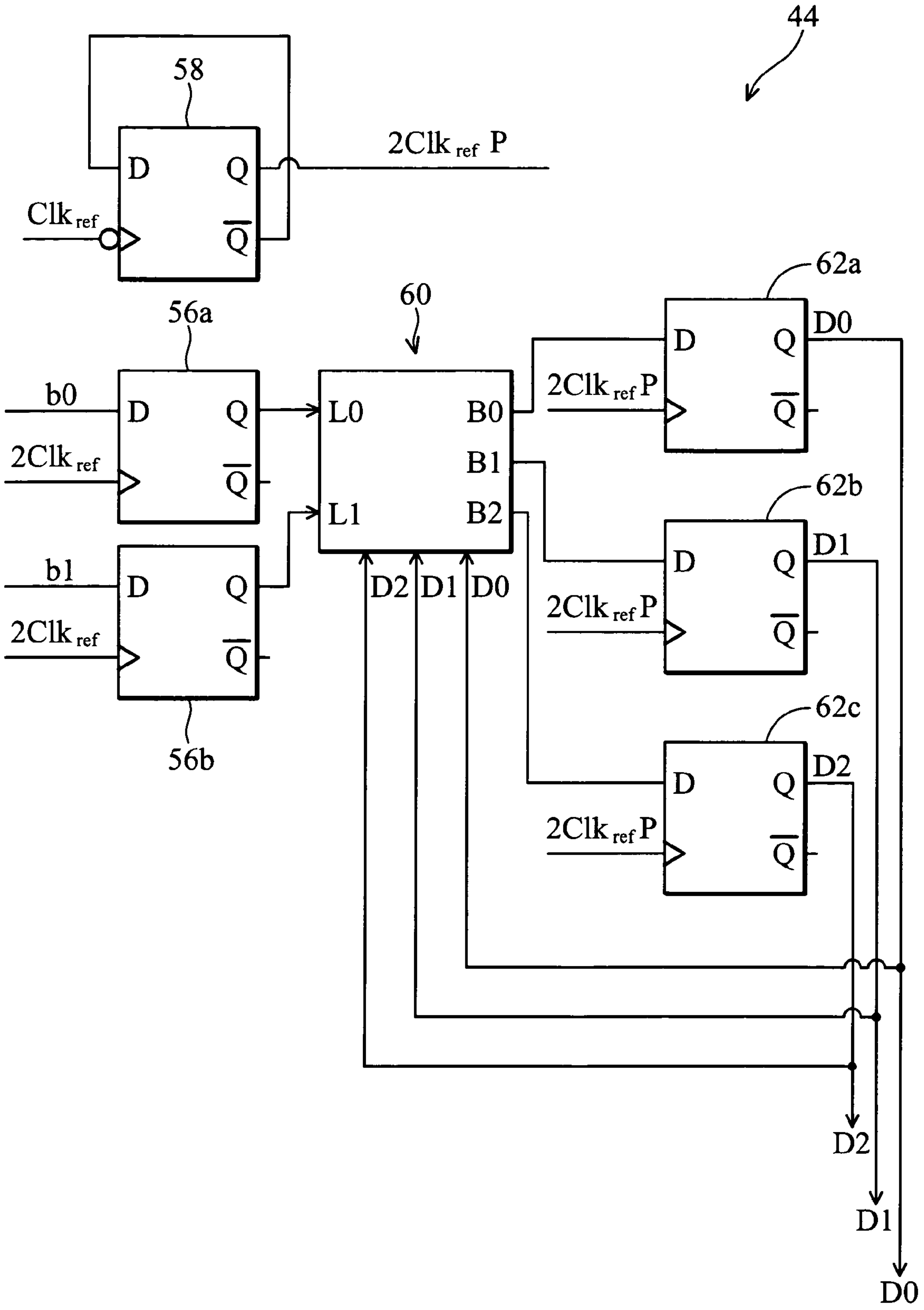
FIG. 7 is a schematic diagram of the weight refreshing circuit in FIG. 5.

FIG. 7 is a schematic diagram of the weight refreshing circuit in FIG. 5 implementing subsequent actions as shown in Table 1. D-type flip-flops 56*a* and 56*b* are rising edge triggered flip-flops. D-type flip-flops 56*a* and 56*b* record the values of signals b0 and b1 respectively before the D-type flip-flops 52*a~c* and 54*a~c* are reset. D-type flip-flop 58 is a falling edge triggered flip-flop which generates a clock $2Clk_{ref}P$ having 90° phase difference with clock $2Clk_{ref}$. Signals D0~D2 indicate the current select state of VCOs 34*a*~34*c*. The logic processor 60 determines the values of signals D0~D2 according to digital signals b0, b1 and D0~D2 after a predetermined time and outputs them at outputs, B0, B1 and B2 to D-type flip-flops 62*a*~62*c* respectively. When the rising edge of clock $2Clk_{ref}P$, the digital signals D0~D2 are refreshed by D-type flip-flops 62*a*~62*c*. Thus, the select state of VCO 34*a*~34*c* is changed or held accordingly.

Figure 8:
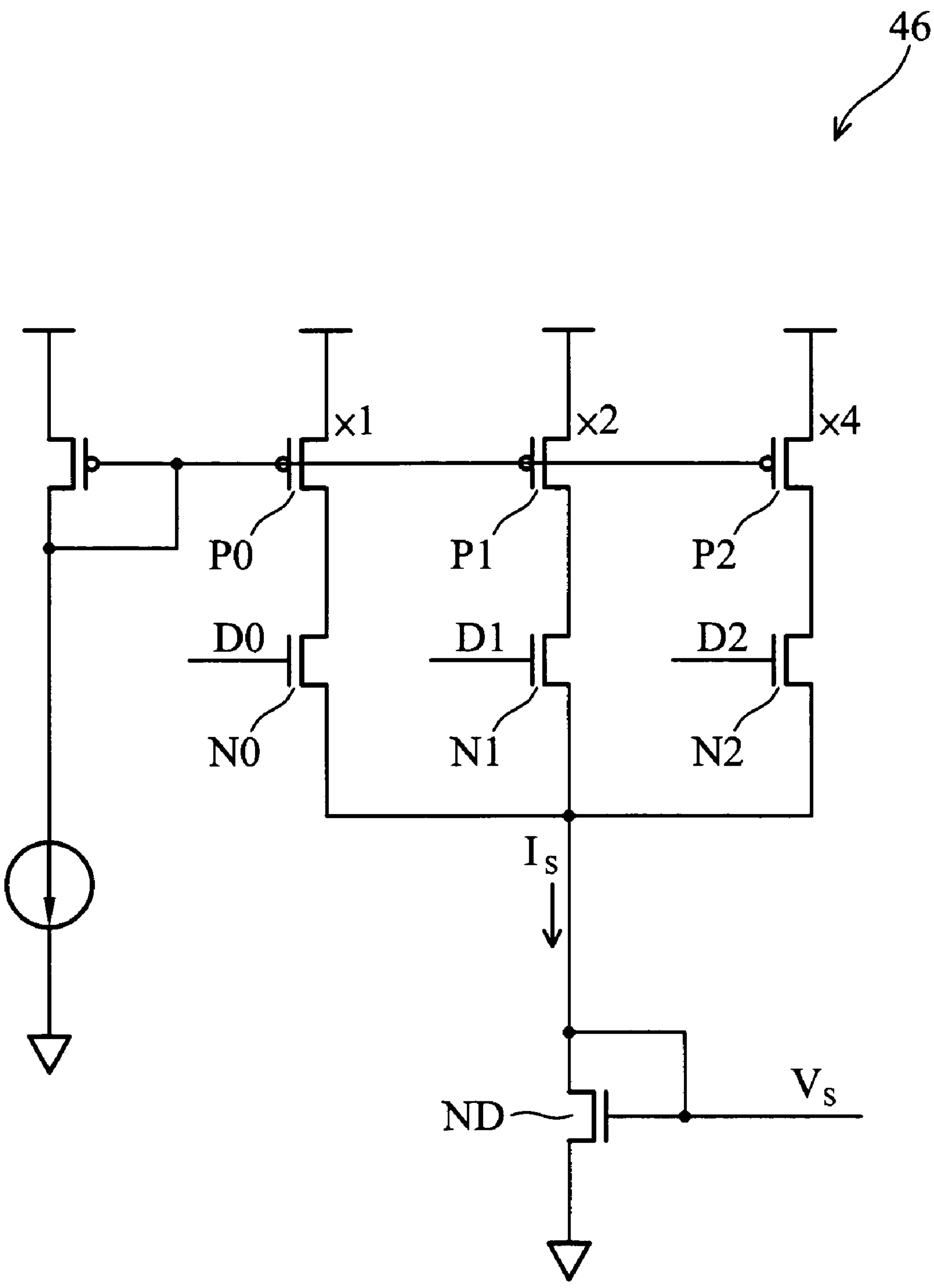
FIG. 8 is a schematic diagram of the select voltage generating circuit in FIG. 5.

FIG. 8 is a schematic diagram of the select voltage generating circuit 46 in FIG. 5. PMOS transistors P0~P2 act as three current-mirrors to provide currents with a ratio of 1:2:4 and NMOS transistors N0~N2 are controlled by digital signals D0~D2. Thus, the select voltage generating circuit 46 converts the digital signals D0~D2 to an analog current $I_s$ which is then converted into an analog voltage, that is, the select voltage $V_s$ by transistor ND.

Figure 9:
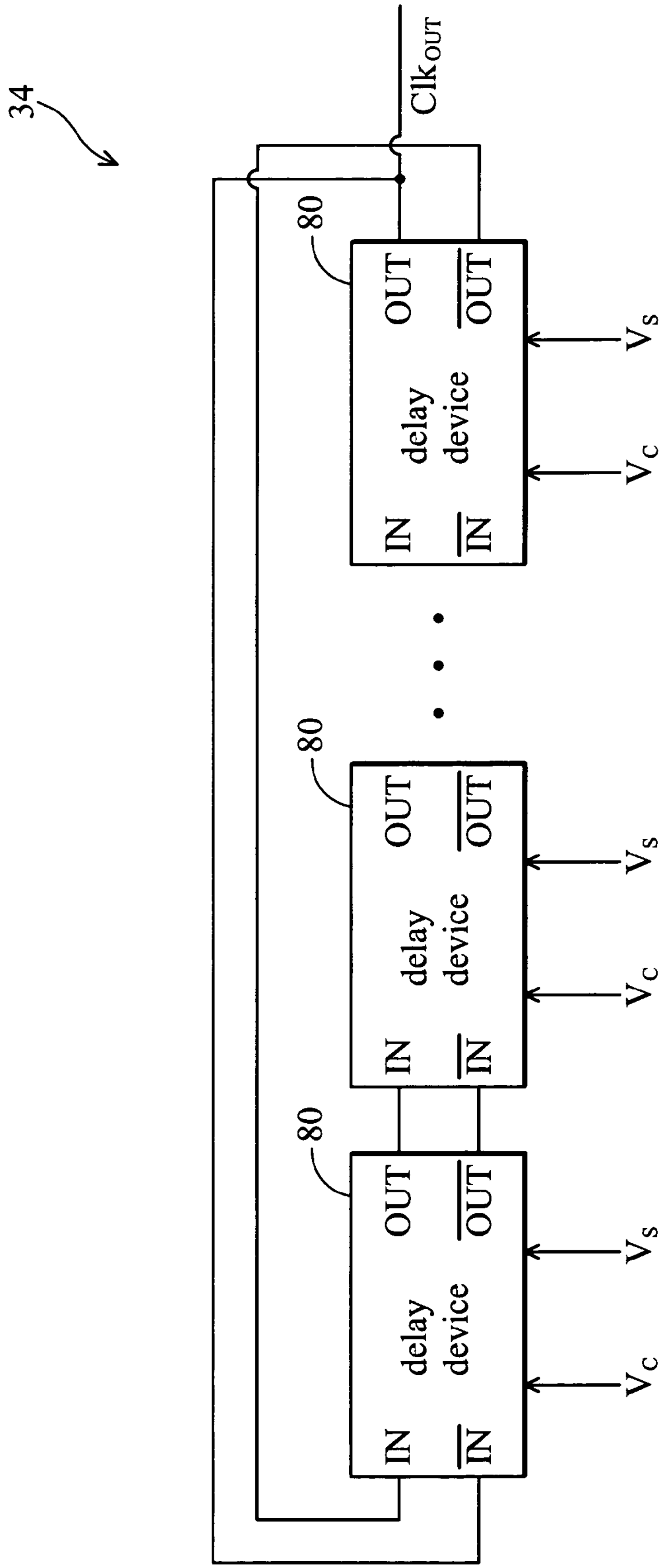
FIG. 9 is a schematic diagram of a VCO.

FIG. 9 is an embodiment of VCO 34 which can also be used as VCOs 34*a*~34*c*. VCO 34 is a ring oscillator formed by cascading a plurality of delay devices 80. The control voltage $V_c$ and select voltage $V_s$ determine the delay time of each delay device 80, thereby the frequency of output clock $Clk_{out}$ in the ring oscillator.

Figure 10:
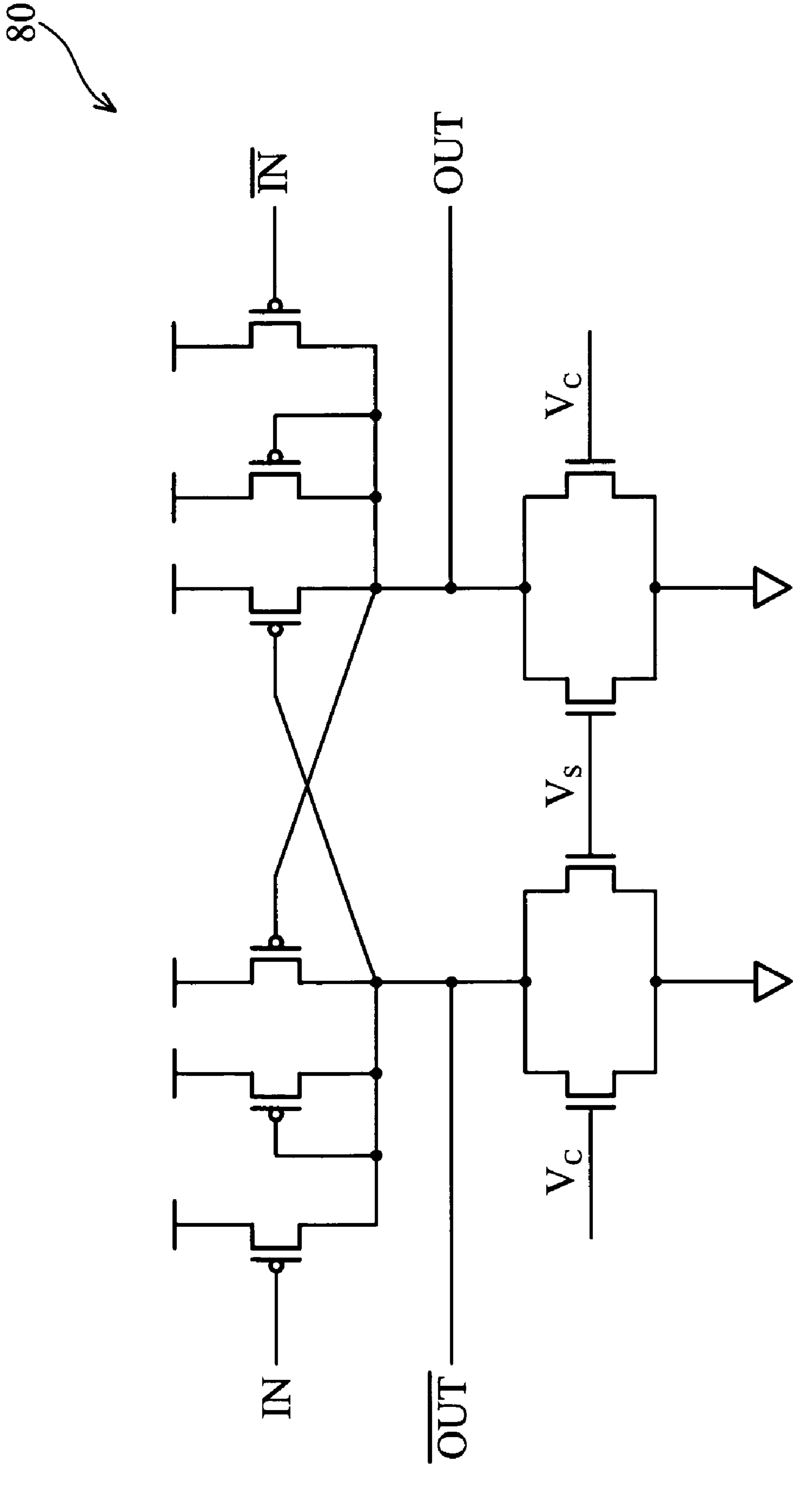
FIG. 10 is a schematic diagram of a delay device in FIG. 9.

FIG. 10 is a schematic diagram of the delay device 80 in FIG. 9, which can be seen as an improved latch circuit. As shown in FIG. 10, the left side is a first inverter and the right side is another inverter. The control voltage $V_c$ and select voltage $V_s$ control the bias current of each inverter, thereby determining the timing for latch signal IN to output signal OUT. Fine tuning of bias current in inverters is controlled by voltage $V_c$ as the coarse tuning is controlled by select voltage $V_s$.

In one embodiment of the invention, a phase lock loop traces a reference clock $Clk_{ref}$ according to a flatter voltage-frequency transfer curve. The output clock, therefore, maintains high stability. Moreover, the tuning frequency range of the phase lock loop is extended with automatic select state S selection. As a result, the phase lock loop maintains the stability of output clock and provides wide tuning frequency range at the same time, which conventional technologies do not provide.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A phase lock loop capable of operating in a plurality of select states, generating a feedback clock tracing a reference clock, the phase lock loop comprising:

a phase/frequency detector comparing phase difference between the feedback clock and the reference clock to generate a comparative signal;

a charge pump generating a control voltage according to the comparative signal;

a voltage-controlled oscillator operating in one of the select states to generate an oscillating clock according to the control voltage and a select voltage, wherein the ratio of the frequency of the oscillating clock to the frequency of the feedback clock is an integer; and a state select circuit adjusting the select voltage in accordance with the reference clock to select one of the select states, comprising:

a highest/lowest clock generator, generating a highest frequency clock and a lowest frequency clock wherein the highest frequency and lowest frequency clocks corresond to the highest frequency oscillating clock and the lowest frequency oscillating clock generated by the voltage-controlled oscillator in one of the select states respectively;

a frequency comparator comparing the frequency of the reference clock with the frequency of the highest frequency oscillating clock and the frequency of the lowest frequency oscillating clock and generate a comparison result signal; and a control circuit generating the select voltage according to the comparison result signal to the highest/lowest clock generator and the voltage-controlled oscillator;

wherein the voltage-controlled oscillator is a first voltage-controlled oscillator, and the highest/lowest clock generator comprises a second voltage-controlled oscillator and a third voltage-controlled oscillator receiving the select voltage to generate the highest frequency clock and the lowest frequency clock according to a first fixed voltage and a second fixed voltage respectively wherein the first fixed voltage is the maximum control voltage and the second fixed voltage is the minimum control voltage.

2. The phase lock loop of claim 1, wherein the phase lock loop further comprises a frequency divider dividing the frequency of the oscillating clock to generate the feedback clock.

3. The phase lock loop of claim 1, wherein the frequency comparator comprises:

a first comparison circuit checking if the highest frequency oscillating clock has a first number of transitional edges within one period of the reference clock; and a second comparison circuit checking if the lowest frequency oscillating clock has a second number of transitional edges within one period of the reference clock;

wherein the comparison result signal is generated according to the comparison results of the first and second comparison circuits.

4. The phase lock loop of claim 3, wherein the control circuit comprises:

a weight refreshing circuit coupled to the first comparison circuit and the second comparison circuit to generate a digital signal; and a select voltage generating circuit converting the digital signal to the select voltage;

wherein the weight refreshing circuit increases the value of the digital signal when the comparison results of the first and second comparison circuits are in a first condition;

the weight refreshing circuit decreases the value of the digital signal when the comparison results of the first and second comparison circuits are in a second condition; and the weight refreshing circuit holds the value of the digital signal when the comparison results of the first and second comparison circuits are in a third condition.

5. The phase lock loop of claim 4, wherein the select voltage generating circuit comprises:

a digital to analog current converter converting the digital signal into a select current; and a current to voltage converter converting the select current into the select voltage.

6. The phase lock loop of claim 4, wherein the weight refreshing circuit comprises:

a first recorder recording the comparison result signal;

a second recorder recording the digital signal; and a logic processor allowing the weight refreshing circuit to hold or change the digital signal according to the outputs of the first and second recorders.

7. The phase lock loop of claim 3, wherein the first and second comparison circuits comprise a plurality of D-type flip-flops coupled in series.

8. The phase lock loop of claim 1, wherein the voltage-controlled oscillator comprises a plurality of delay devices coupled in series and the delay time of each delay device is controlled by the control voltage and the select voltage.

9. A method for controlling a phase lock loop, the phase lock loop capable of operating in a plurality of select states, generating a feedback clock to trace a reference clock and operating in one of select states, the method comprising:

generating a first clock and a second clock corresponding to the highest and lowest frequency oscillating clocks generated by the phase lock loop operating in one of the select states respectively;

comparing the frequency of the first clock and the frequency of the reference clock;

comparing the frequency of the second clock and the frequency of the reference clock;

holding the select state of the phase lock loop when the first, second, and reference clocks are in a first predetermined condition; and changing the select state of the phase lock loop when the first, second, and reference clocks are in a second predetermined conditions;

wherein the phase lock loop comprises a state select circuit and a first voltage-controlled oscillator operating in one of the select states, adjusting a select voltage to generate the first and second clocks by the state select circuit comprising:

supplying second and third voltage-controlled oscillators, receiving the select voltage; and supplying first and second fixed voltages to the second and third voltage-controlled oscillators to generate the first and second clocks respectively wherein the first fixed voltage is one of the maximum and minimum control voltages when the second fixed voltage is the other in the first voltage-controlled oscillator.

10. The method of claim 9, wherein the first predetermined condition comprises frequency of the reference clock within the frequencies of the first and second clocks.

11. The method of claim 9, wherein comparing the frequency of the first clock and the frequency of the reference clock comprises:

calculating the number of transitional edges in the first clock within one period of the reference clock; and comparing the number to a predetermined value.

12. The method according to claim 9, wherein comparing the frequency of the second clock and the frequency of the reference clock comprises:

calculating the number of transitional edges in the second clock within one period of the reference clock; and comparing the number to the predetermined value.

* * * * *